US012689288B2

(12) United States Patent
Yoshizawa

(10) Patent No.: US 12,689,288 B2
(45) Date of Patent: Jul. 21, 2026

(54) INTEGRATED CIRCUIT FOR POWER SUPPLY AND POWER SUPPLY SYSTEM

(71) Applicant: FUJI ELECTRIC CO., LTD., Kanagawa (JP)

(72) Inventor: Tsuyoshi Yoshizawa, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 105 days.

(21) Appl. No.: 18/544,475

(22) Filed: Dec. 19, 2023

(65) Prior Publication Data

US 2024/0275270 A1 Aug. 15, 2024

(30) Foreign Application Priority Data

Feb. 9, 2023 (JP) ................................. 2023-018081

(51) Int. Cl.
*H02M 1/32* (2007.01)
*G01R 19/165* (2006.01)
*H02M 1/00* (2007.01)
*H02M 1/36* (2007.01)
*H02M 3/06* (2006.01)
*H02M 7/04* (2006.01)

(52) U.S. Cl.
CPC ...... *H02M 1/322* (2021.05); *G01R 19/16547* (2013.01); *H02M 1/0032* (2021.05); *H02M 1/36* (2013.01); *H02M 3/06* (2013.01); *H02M 7/04* (2013.01)

(58) Field of Classification Search
CPC .......... H02M 3/06; H02M 1/126; H02M 1/36; H02M 1/0032; H02M 1/322; G01R 19/16547
See application file for complete search history.

(56) References Cited

U.S. PATENT DOCUMENTS

2013/0147440 A1* 6/2013 Shiroyama .............. H02M 7/02
320/166
2014/0233285 A1* 8/2014 Nishijima ............... H02M 1/36
363/127
2015/0263542 A1 9/2015 Sato
(Continued)

FOREIGN PATENT DOCUMENTS

| | | |
|---|---|---|
| JP | 2015177687 A | 10/2015 |
| JP | 2019047621 A | 3/2019 |
| WO | 2012033120 A1 | 3/2012 |

*Primary Examiner* — Patrick C Chen

(57) ABSTRACT

An integrated circuit for a power supply is provided that is connected to an AC power supply via an input circuit including a capacitor, comprising: a voltage dividing unit that divides an input voltage to generate a divided voltage; a shutoff detection unit that compares the divided voltage with a predetermined reference voltage to detect shutoff of the AC power supply; and a discharge unit that discharges accumulated charge in the capacitor when shutoff of the AC power supply is detected, wherein the voltage dividing unit sets a ratio of the divided voltage to the input voltage to a first voltage division ratio when no shutoff of the AC power supply is detected, and sets a ratio of the divided voltage to the input voltage to a second voltage division ratio greater than the first voltage division ratio when shutoff of the AC power supply is detected.

4 Claims, 7 Drawing Sheets

(56) References Cited

U.S. PATENT DOCUMENTS

2016/0380552 A1* 12/2016 Chung .................... H02M 1/44
363/84
2019/0074761 A1    3/2019 Matsuda
2022/0320889 A1* 10/2022 Ono ..................... H02M 1/322

* cited by examiner

INTEGRATED CIRCUIT FOR POWER SUPPLY AND POWER SUPPLY SYSTEM

The contents of the following patent application(s) are incorporated herein by reference:

NO. 2023-018081 filed in JP on Feb. 9, 2023

BACKGROUND

1. Technical Field

The present invention relates to an integrated circuit for a power supply and a power supply system.

2. Related Art

The Patent document 1 describes "an integrated circuit device for power supply that discharges a capacitor" when "an AC power supply is shut off and a power shutoff detection method".

PRIOR ART DOCUMENT

Patent Document

Patent Document 1: International Publication No. 2012/033120

Patent Document 2: Japanese Patent Application Publication No. 2015-177687

Patent Document 3: Japanese Patent Application Publication No. 2019-47621

DESCRIPTION OF EXEMPLARY EMBODIMENTS

Hereinafter, the present invention will be described through embodiments of the invention, but the following embodiments do not limit the invention according to claims. In addition, not all of the combinations of features described in the embodiments are essential to the solution of the invention.

Figure 1:
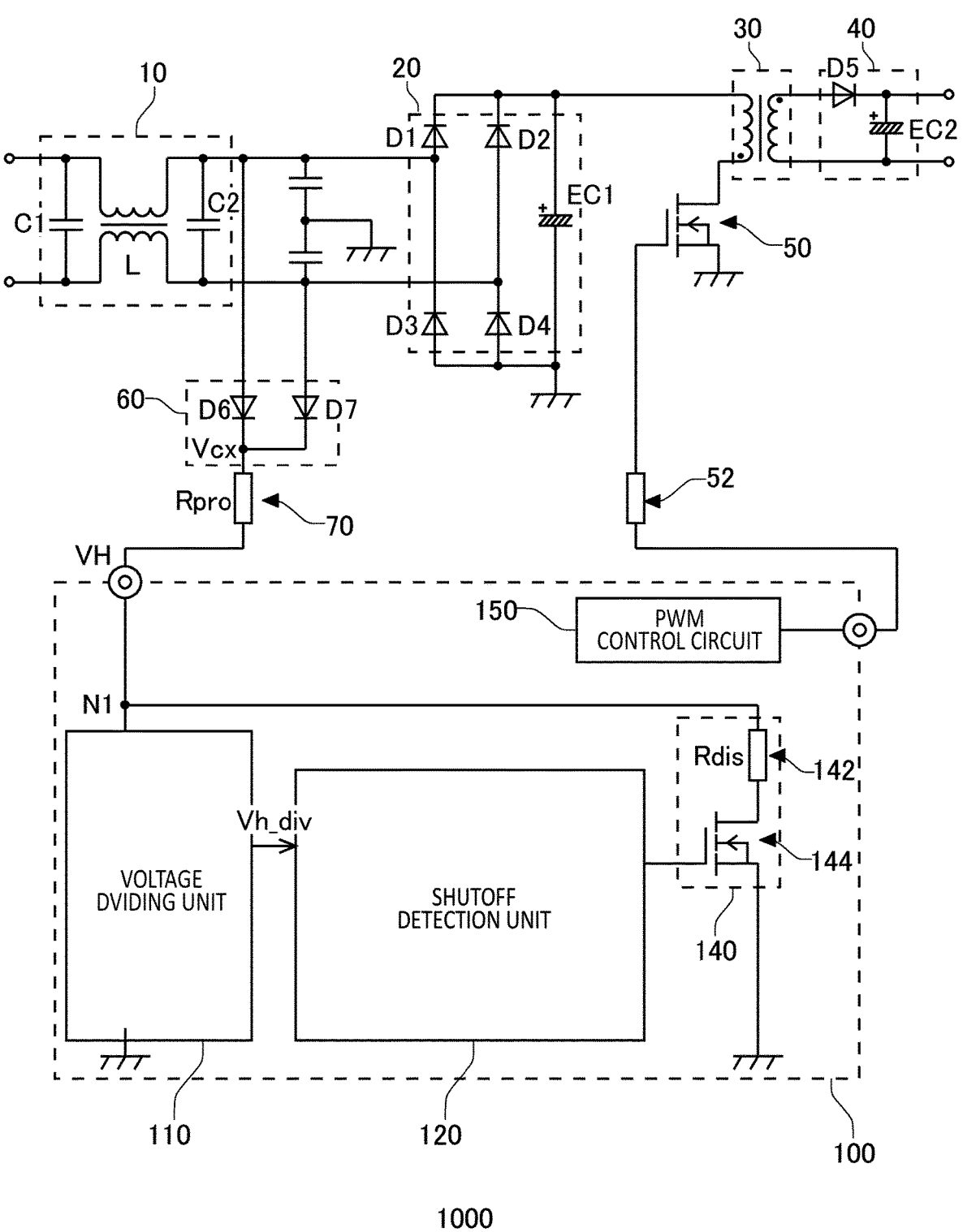
FIG. 1 illustrates an example of a configuration of a power supply system 1000.

FIG. 1 illustrates an example of a configuration of a power supply system 1000. The power supply system 1000 includes an input circuit 10 and an integrated circuit 100 for a power supply. The power supply system 1000 may include a primary rectifying and smoothing circuit 20, a transformer 30, a secondary rectifying and smoothing circuit 40, a switch 50 for a transformer, a gate resistor 52, a full-wave rectifying circuit 60, and a protective resistor 70. The power supply system 1000 may be a system that is connected between an AC power supply and a load, and generates a predetermined DC voltage from inputted AC voltage to supply it to the load.

The input circuit 10 may include capacitors C1, C2, and may include an inductor L. The input circuit 10 may eliminate common mode noise from an input AC voltage inputted from the AC power supply. The input circuit 10 may reduce differential mode noise or normal mode noise superimposed on the input AC voltage inputted from the AC power supply.

The primary rectifying and smoothing circuit 20 may include diodes D1, D2, D3, D4, and may include an electrolytic capacitor EC1. The primary rectifying and smoothing circuit 20 may convert the input AC voltage into DC voltage. The primary rectifying and smoothing circuit 20 may smooth the voltage variation of the rectified DC voltage.

The transformer 30 may convey the energy on the primary side to the secondary side. The transformer 30 may operate as a DC-DC converter that converts an input DC voltage into a predetermined DC voltage.

The secondary rectifying and smoothing circuit 40 may include a diode D5, and may include an electrolytic capacitor EC2. Secondary rectifying and smoothing circuit 40 may smooth the voltage variation of the DC voltage.

The switch 50 for the transformer may connect, via the gate resistor 52, the transformer 30 and the PWM control circuit 150 which will be described below. The power supply system 1000 may supply a predetermined DC voltage by causing the PWM control circuit 150 to control the switch 50 for a transformer.

The full-wave rectifying circuit 60 may include diodes D6, D7. The full-wave rectifying circuit 60 may be connected between the input circuit 10 and the integrated circuit 100 for a power supply. The full-wave rectifying circuit 60 may full-wave rectify the input AC voltage inputted via the input circuit 10. That is, the full-wave rectifying circuit 60 may rectify the input AC voltage inputted via the input circuit 10 so as to obtain positive output voltage. The full-wave rectifying circuit 60 may output a full-wave rectified voltage Vcx.

The protective resistor 70 may be connected between the full-wave rectifying circuit 60 and the integrated circuit 100 for a power supply. The protective resistor 70 may be connected between the capacitors C1, C2 of the input circuit 10 and the first node N1 of the integrated circuit 100 for a power supply. The protective resistor 70 may protect the integrated circuit 100 for a power supply from the surge current. A resistance value Rpro of the protective resistor 70 may be 1 kΩ or more and 25 kΩ or less. As an example, the resistance value Rpro of the protective resistor 70 is 5 kΩ.

The integrated circuit 100 for a power supply may discharge the accumulated charge remaining in the capacitors C1, C2 of the input circuit 10 while taking into account the influence of voltage drop caused by the protective resistor 70. When the power supply system 1000 is shut off from the AC power supply, the accumulated charge remains in the capacitors C1, C2 of the input circuit 10. Since the voltage from the accumulated charge remaining in the capacitors C1, C2 poses the risk of an electric shock, the accumulated charge may be discharged after the power supply system 1000 is shut off from the AC power supply. The phrase that the power supply system 1000 is shut off from the AC power supply may indicate that the power supply system 1000 is disconnected from the AC power supply. By the integrated circuit 100 for a power supply taking into account the voltage drop caused by the protective resistor 70, the accumulated charge remaining in the capacitors C1, C2 of the input circuit 10 can be discharged reliably. The details of discharge by the integrated circuit 100 for a power supply will be described below.

The integrated circuit 100 for a power supply includes a voltage dividing unit 110, a shutoff detection unit 120, and a discharge unit 140. The integrated circuit 100 for a power supply may include a PWM control circuit 150. The integrated circuit 100 for a power supply may be connected to the AC power supply via the input circuit 10 including the capacitors.

The voltage dividing unit 110 may include a plurality of resistive elements. The voltage dividing unit 110 divides the input voltage VH to generate the divided voltage Vh_div. The divided voltage Vh_div may be generated by the plurality of resistive elements. Exemplary configurations of the voltage dividing unit 110 will be described below.

The shutoff detection unit 120 may include a comparator. The shutoff detection unit 120 compares the divided voltage Vh_div with a predetermined reference voltage to detect shutoff of the AC power supply. That is, the shutoff detection unit 120 may compare the divided voltage Vh_div with the predetermined reference voltage to detect that the power supply system 1000 is disconnected from the AC power supply. The divided voltage Vh_div and the reference voltage may be compared by the comparator. Exemplary configurations of the shutoff detection unit 120 will be described below.

The discharge unit 140 may include a discharge resistor 142 and a discharge switch 144. The discharge of the accumulated charge in the capacitors C1, C2 of the input circuit 10 may be controlled by controlling the on/off state of the discharge switch 144.

The discharge resistor 142 may be connected at one end to the first node N1. The resistance value Rdis of the discharge resistor 142 may be 2 kΩ or more and 50 kΩ or less. As an example, the resistance value Rdis of the discharge resistor 142 is 10 kΩ.

The discharge switch 144 may be connected between another end of the discharge resistor 142 and the ground. The discharge switch 144 may be controlled by the shutoff detection unit 120. The shutoff detection unit 120 may control the discharge switch 144 to be in the off state when no shutoff of the AC power supply is detected, and may control the discharge switch 144 to be in the on state when a shutoff of the AC power supply is detected.

When the shutoff detection unit 120 detects shutoff of the AC power supply, the discharge unit 140 may discharge the accumulated charge in capacitors C1, C2 of the input circuit 10. That is, the discharge unit 140 may discharge the accumulated charge in the capacitors C1, C2 of the input circuit 10 by the discharge switch 144 being controlled to be in the on state when shutoff of the AC power supply is detected.

While the power supply system 1000 is connected to the AC power supply, the discharge switch 144 is controlled to be in the off state, and thus the current does not flow through the discharge resistor 142 and no accumulated charge in the capacitors C1, C2 in the input circuit 10 is discharged. In this manner, it is possible to prevent constant power loss from occurring in the input circuit 10 connected to the AC power supply. When the power supply system 1000 is shut off from the AC power supply, the discharge switch 144 is controlled to be in the on state, and thus the current flows through the discharge resistor 142 and the accumulated charge in the capacitors C1, C2 of the input circuit 10 can be discharged.

The configuration of the discharge unit 140 is not specifically limited provided that such a discharge unit is capable of discharging the accumulated charge in the capacitors C1, C2 of the input circuit 10. In the present example, although the discharge unit 140 is described to include the discharge resistor 142 and the discharge switch 144, the discharge resistor 142 may be configured to include a plurality of resistive elements connected in series, to include a plurality of resistive elements connected in parallel or to include combination of these.

The PWM control circuit 150 may control the on/off state of the switch 50 for the transformer. The power supply system 1000 may supply a predetermined DC voltage by causing the PWM control circuit 150 to control the switch 50 for a transformer. In the present example, although the PWM control circuit 150 is described to be included in the integrated circuit 100 for a power supply, the PWM control circuit 150 may be provided external to the integrated circuit 100 for a power supply.

Figure 2:
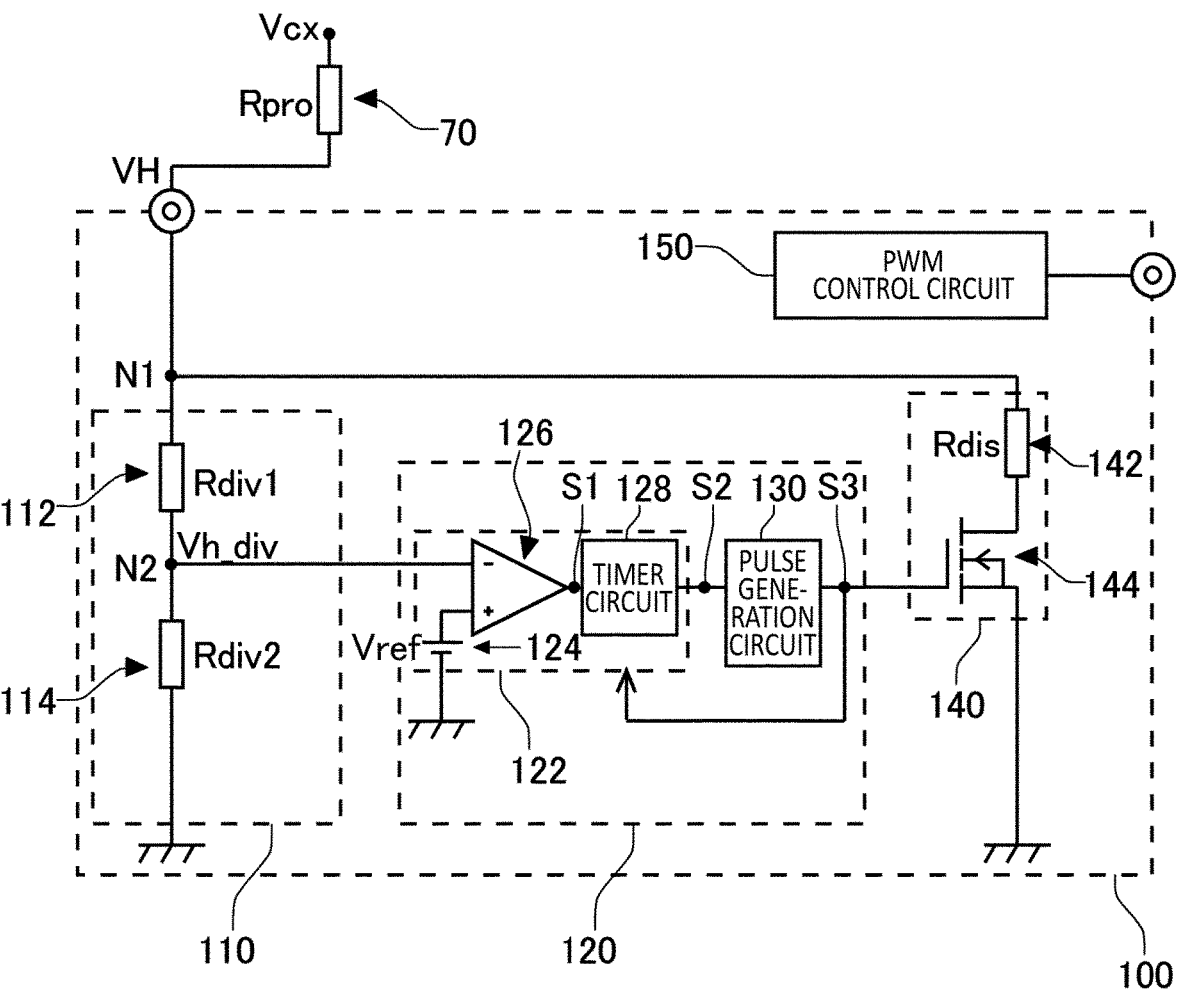
FIG. 2 illustrates an example of a configuration of an integrated circuit 100 for a power supply.

FIG. 2 illustrates an example of the configuration of the integrated circuit 100 for a power supply. The integrated circuit 100 for a power supply according to the present example is capable of taking into account the influence of the voltage drop caused by the protective resistor 70, by controlling the on/off state of the discharge switch 144 during discharging time period when shutoff of the AC power supply is detected.

The voltage dividing unit 110 may include the first voltage dividing resistor 112 and the second voltage dividing resistor 114. The voltage dividing unit 110 may divide the input voltage VH by the first voltage dividing resistor 112 and the second voltage dividing resistor 114 to generate the divided voltage Vh_div.

The first voltage dividing resistor 112 is connected between the first node N1 and the second node N2. The resistance value Rdiv1 of the first voltage dividing resistor 112 may be 30 MΩ or more and 750 MΩ or less. As an example, the resistance value Rdiv1 of the first voltage dividing resistor 112 is 149 MΩ.

The second voltage dividing resistor 114 is connected between the second node N2 and the ground. The resistance value Rdiv2 of the second voltage dividing resistor 114 may be 0.2 MΩ or more and 5 MΩ or less. As an example, the resistance value Rdiv2 of the second voltage dividing resistor 114 is 1 MΩ. The discharge resistor 142 may be connected in parallel with the first voltage dividing resistor 112 and the second voltage dividing resistor 114.

The divided voltage Vh_div generated by the voltage dividing unit 110 according to the present example is expressed by Equation 1.

$$\text{Vh\_div} = VH \times Rdiv2/(Rdiv1 + Rdiv2) \qquad \text{Equation 1}$$

That is, the voltage dividing unit 110 may divide the input voltage VH to generate the divided voltage Vh_div which is equal to the input voltage VH multiplied by Rdiv2/(Rdiv1+ Rdiv2). As an example, assuming that the resistance value Rdiv1 of the first voltage dividing resistor 112 is 149 MΩ and the resistance value Rdiv2 of the second voltage dividing resistor 114 is 1 MΩ, the voltage dividing unit 110 will generate the divided voltage Vh_div which is equal to the input voltage VH multiplied by 1/150.

When the discharge switch 144 is in the off state and discharging is not in progress, the resistance value of the first voltage dividing resistor 112 and the second voltage dividing resistor 114 is higher than the resistance value of the protective resistor 70, so no significant influence of the voltage drop caused by the protective resistor 70 is experienced, and the input voltage VH can be considered to be almost the same as the output voltage Vcx of the full-wave rectifying circuit 60. On the other hand, when the discharge switch 144 is in the on state and discharging is in progress, the current flows through the current path including the protective resistor 70 and the discharge resistor 142, so the influence of the voltage drop caused by the protective resistor 70 cannot be ignored. In this case, the input voltage VH is expressed by Equation 2.

$$VH = Vcx \times Rdis/(Rpro + Rdis) \qquad \text{Equation 2}$$

As described above, because the input voltage VH inputted to the integrated circuit 100 for a power supply varies depending on the on/off state of the discharge switch 144, the divided voltage Vh_div also varies, and this variation would also affect the result of the comparison performed in the shutoff detection unit 120 between the divided voltage Vh_div and the reference voltage. Integrated circuit 100 for a power supply may discharge the accumulated charge remaining in the capacitors C1, C2 of the input circuit 10 while taking into account the influence of the voltage drop at the protective resistor 70.

The shutoff detection unit 120 may include a shutoff detection circuit 122 and a pulse generation circuit 130. The shutoff detection circuit 122 may include a voltage supply 124, a comparator 126, and a timer circuit 128.

The comparator 126 compares the divided voltage Vh_div with the reference voltage Vref generated by the voltage supply 124. When the divided voltage Vh_div is higher than the reference voltage Vref, the output signal S1 of the comparator 126 may be at low level, and when the divided voltage Vh_div is lower than the reference voltage Vref, the output signal S1 of the comparator 126 may be at high level.

The timer circuit 128 may measure the elapsed time from when the output signal S1 of the comparator 126 indicates that the divided voltage Vh_div has become lower than the reference voltage Vref. As an example, the timer circuit 128 may measure the elapsed time from when the level of the output signal S1 of the comparator 126 has become high. That is, in the shutoff detection circuit 122 according to the present example, it is indicated by the output signal S1 of the comparator 126 becoming high level that the divided voltage Vh_div is lower than the reference voltage Vref. The shutoff detection unit 120 may detect shutoff of the AC power supply when the elapsed time measured by the timer circuit 128 exceeds the predetermined reference time. When the measured time exceeds the reference time, the timer circuit 128 may switch the level of the output signal S2 from low to high. Exemplary operations of the comparator 126 and the timer circuit 128 will be described below.

A pulse generation circuit 130 may generate a periodic pulse signal S3 to control the on/off state of the discharge switch 144. The discharge switch 144 may be controlled to be in the on state when the output signal S3 of the pulse generation circuit 130 is at high level, and controlled to be in the off state when the output signal S3 of the pulse generation circuit 130 is at low level.

The timer circuit 128 may control the pulse generation circuit 130. When the output signal S2 of the timer circuit 128 is at high level, the pulse generation circuit 130 may be controlled to be in the operating state, and when the output signal S2 of the timer circuit 128 is at low level, the pulse generation circuit 130 may be controlled to be in a standby state.

The level information of the output signal S3 of the pulse generation circuit 130 may be provided to the shutoff detection circuit 122. The shutoff detection circuit 122 may be controlled to be in the standby state when the output signal S3 of the pulse generation circuit 130 is at high level, i.e. when the discharge switch 144 is controlled to be in the on state and discharging is in progress. The shutoff detection circuit 122 may be controlled to be in the operating state when the output signal S3 of the pulse generation circuit 130 is at low level, i.e. when the discharge switch 144 is controlled to be in the off state and discharging is not in progress. The exemplary operations of the shutoff detection circuit 122, the pulse generation circuit 130, and the discharge switch 144 will be described below.

Figure 3:
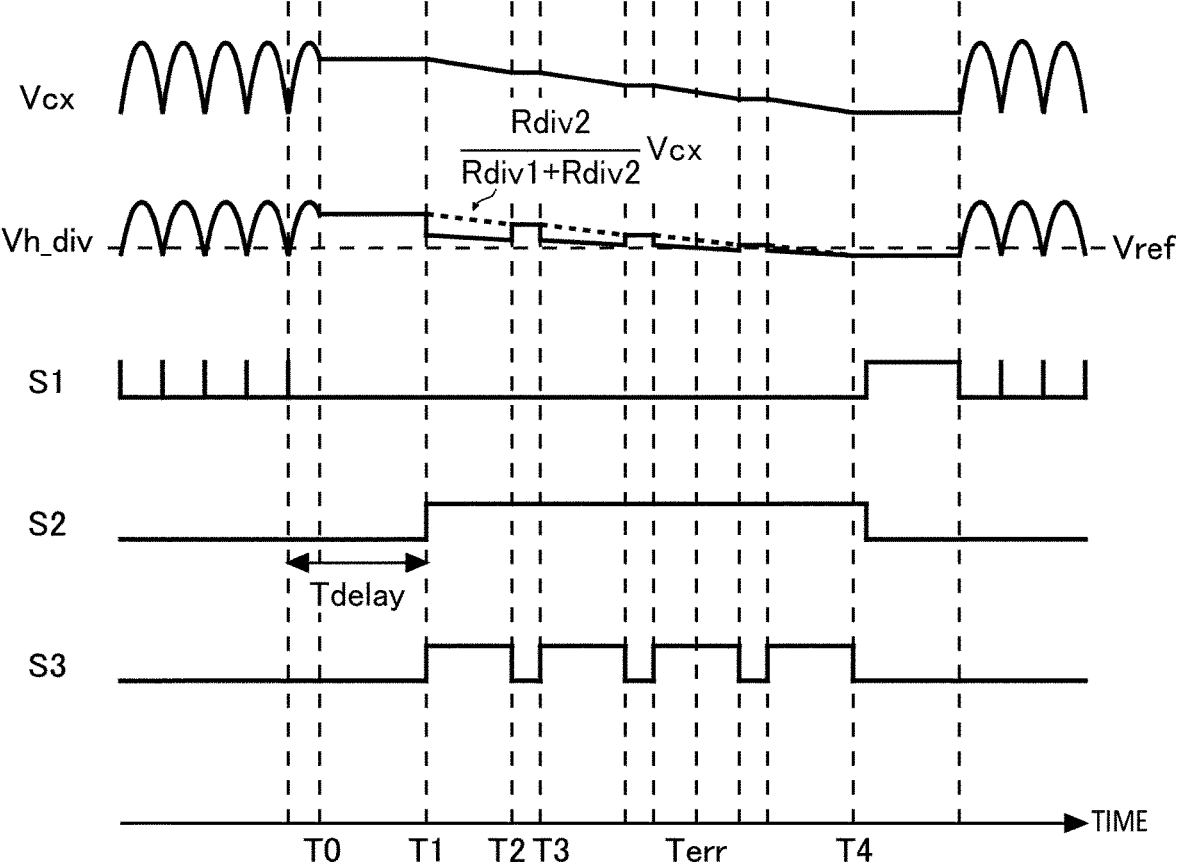
FIG. 3 illustrates an example of a waveform diagram representing an operation of the integrated circuit 100 for a power supply.

FIG. 3 illustrates an example of a waveform diagram representing an operation of the integrated circuit 100 for a power supply. The first row represents a temporal waveform of the output voltage Vcx of the full-wave rectifying circuit 60, the second row represents a temporal waveform of the divided voltage Vh_div, the third row represents an output signal S1 of the comparator 126, the fourth row represents an output signal S2 of the timer circuit 128, and the fifth row represents an output signal S3 of the pulse generation circuit 130.

Time T0 shows the time at which the power supply system 1000 is shut off from the AC power supply, and before time T0, the power supply system 1000 is connected to the AC power supply. While the AC power supply is connected, Vcx forms a voltage waveform obtained by full-wave rectifying the AC power supply. The divided voltage Vh_div forms a voltage waveform obtained by multiplying the input voltage VH, which can be considered to be almost the same as Vcx, by Rdiv2/(Rdiv1+Rdiv2). Comparison is made between the divided voltage Vh_div and the reference voltage Vref at the comparator 126. The output signal S1 of the comparator 126 becomes high level when the divided voltage Vh_div is below the reference voltage Vref, and becomes low level when it is above the reference voltage Vref. That is, the output signal S1 of the comparator 126 forms an output signal having twice the frequency of that of the AC power supply conforming to the full-wave rectified signal.

The timer circuit 128 may measure the elapsed time from when the level of the output signal S1 of the comparator 126 has become low. When the measured time exceeds the reference time Tdelay, the timer circuit 128 may switch the level of the output signal S2 from low to high. The reference time Tdelay may be defined to be longer than a periodic time of the output signal S1 that is outputted by the comparator 126 while the power supply system 1000 is connected to the AC power supply. As an example, assuming that the frequency of the AC power supply is 50 Hz, the periodic time of the output signal S1 of the comparator 126 is 10 ms. In this case, the reference time Tdelay may by defined to be longer than 10 ms.

Before time T0, the output signal S1 of the comparator 126 is switched between low level and high level periodically at a time period shorter than the predetermined reference time Tdelay, so the timer circuit 128 does not switch the output signal S2 from low level to high level, and the output signal S2 is kept at low level. Because the output signal S2 of the timer circuit 128 is kept at low level, the pulse generation circuit 130 is controlled to be in the standby state, and the output signal S3 of the pulse generation circuit 130 is also kept at low level.

From time T0 at which the AC power supply is shut off to time T1 at which the output signal S2 of the timer circuit 128 is changed to high level, Vcx represents a voltage signal that corresponds to the accumulated charge remaining in the capacitors C1, C2 of the input circuit 10. The divided voltage Vh_div becomes a voltage obtained by multiplying the input voltage VH, which can be considered to be almost the same as Vcx, by Rdiv2/(Rdiv1+Rdiv2). Because the divided voltage Vh_div is kept higher than the reference voltage Vref, the output signal S1 of the comparator 126 is also kept at low level. The output signal S2 of the timer circuit 128 is also kept at low level until the measured time obtained by the timer circuit exceeds the reference time Tdelay, i.e. until time T1 comes. Accordingly, the output signal S3 of the pulse generation circuit 130 is also kept at low level.

At time T1, the output signal S2 of the timer circuit 128 is changed to high level. That is, time T1 is the time at which the elapsed time from when the level of the output signal S1 of the comparator 126 has become low exceeds the predetermined reference time Tdelay. By the elapsed time from when the level of the output signal S1 of the comparator 126 has become low exceeding the predetermined reference time Tdelay, shutoff of the AC power supply is detected and the output signal S2 of the timer circuit 128 is changed to high level.

When the output signal S2 of the timer circuit 128 is changed to high level at time T1, the pulse generation circuit 130 is controlled to be in the operating state and generates a periodic pulse signal S3. While the output signal S3 is at high level (from time T1 to T2), Vcx decreases due to discharging performed by controlling the discharge switch 144 to be in the on state. In accordance with this, the divided voltage Vh_div also decreases.

In the temporal waveform of the divided voltage Vh_div from time T1 to T2, the dotted line represents the voltage obtained by multiplying Vcx by Rdiv2/(Rdiv1+Rdiv2), and the solid line represents the voltage obtained by multiplying VH by Rdiv2/(Rdiv1+Rdiv2), which is in other words the voltage that is actually supplied to the comparator 126. In this manner, during the discharging operation in which the discharge switch 144 is controlled to be in the on state, the divided voltage Vh_div falls due to the influence of the voltage drop caused by the protective resistor 70. When comparison is made in this state between the divided voltage Vh_div and the reference voltage Vref, false detection of the discharge state may occur. The false detection of the discharge state can be prevented by controlling the shutoff detection circuit 122 to be in the standby state when the output signal S3 of the pulse generation circuit 130 is at high level.

From time T2 to T3, the output signal S3 is at low level. In this situation, the discharge switch 144 is controlled to be in the off state to stop the discharging and the shutoff detection circuit 122 turns into the operating state from the standby state. That is, the comparison is made, without the influence of the voltage drop caused by the protective resistor 70, between the divided voltage Vh_div and the reference voltage Vref to detect the discharge state. From time T2 to T3, the divided voltage Vh_div is higher than the reference voltage Vref, so there is no variation in any signal level.

In this manner, while the output signal S2 of the timer circuit 128 is at high level, the pulse generation circuit 130 generates a periodic pulse signal S3, and the period in which discharging is in progress and no comparison is made by the comparator 126 (high level period of the output signal S3) and the period in which discharging is not in progress and a comparison is made by the comparator 126 (low level period of the output signal S3) are repeated alternately.

When the low level period of the output signal S3 of the pulse generation circuit 130 starts at time T4, the divided voltage Vh_div falls below the reference voltage Vref, so the end of discharging is detected and the output signal S1 of the comparator 126 becomes high level, the output signal S2 of the timer circuit 128 becomes low level, and the pulse generation circuit 130 is controlled to be in the standby state to end a series of discharging operation.

By controlling the shutoff detection circuit 122 to be in the standby state when the discharge switch 144 is controlled to be in the on state and discharging is in progress, and controlling the shutoff detection circuit 122 to be in the operating state when the discharge switch 144 is controlled to be in the off state and discharging is not in progress, it is possible to detect the discharge state while taking into account the influence of voltage drop caused by the protective resistor 70 and the accumulated charge remaining in the capacitors C1, C2 of the input circuit 10 can be reliably discharged.

For example, at time Terr in the high level period of the output signal S3, the divided voltage Vh_div is below the reference voltage Vref. No comparison is made by the comparator 126 during this period and the false detection that the discharging has ended can be prevented. By not performing detection during the high level period of the output signal S3 and performing detection during the low level period of the output signal S3 while taking into account the influence of the voltage drop caused by the protective resistor 70 during discharging time period, the false detection of the discharge state can be prevented and the accumulated charge remaining in the capacitors C1, C2 of the input circuit 10 can be reliably discharged.

Figure 4:
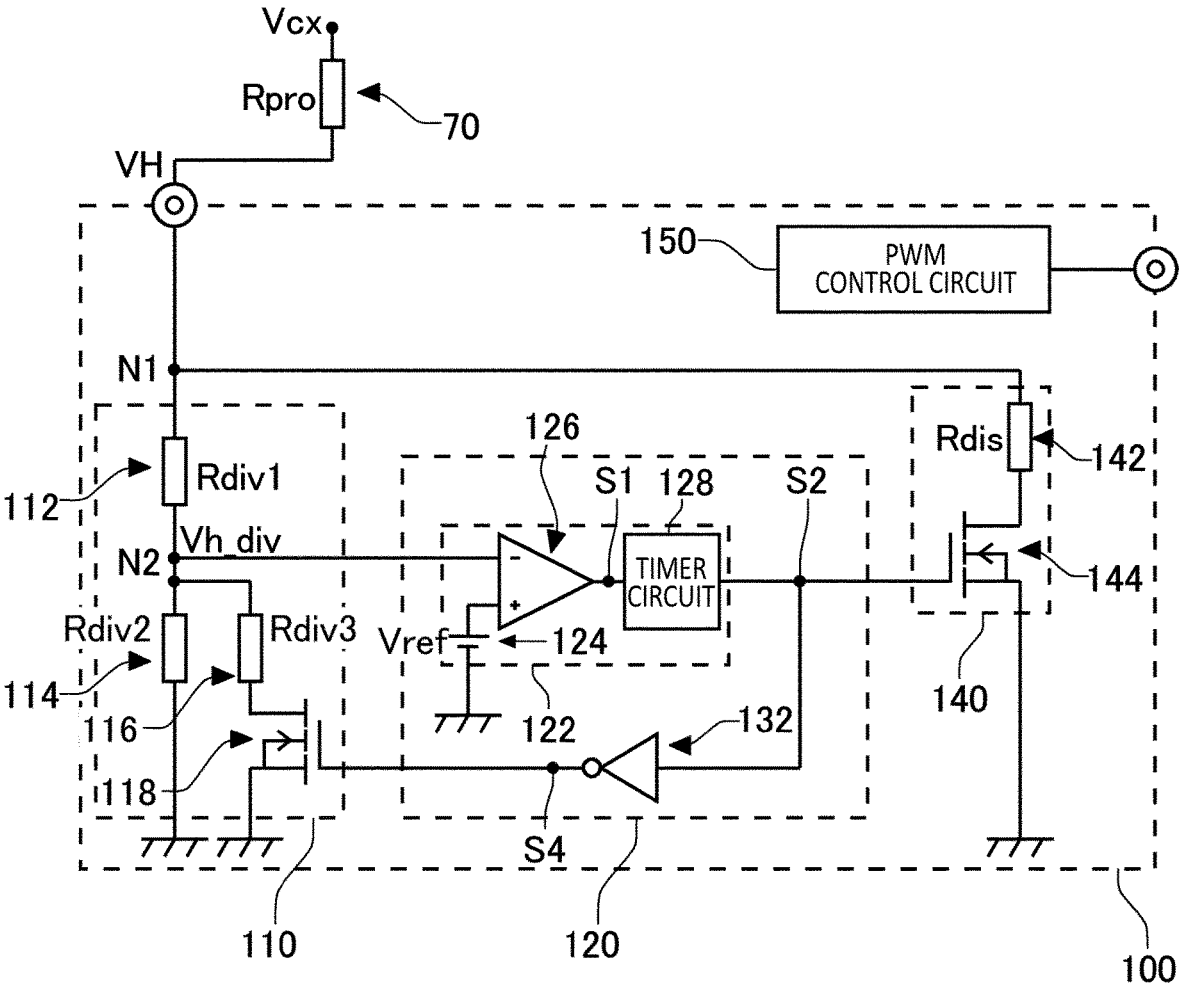
FIG. 4 illustrates a modification example of the configuration of the integrated circuit 100 for a power supply.

FIG. 4 illustrates a modification example of the configuration of the integrated circuit 100 for a power supply. The integrated circuit 100 for a power supply according to the present example is capable of taking into account the influence of voltage drop caused by the protective resistor 70 by changing a voltage division ratio for generating the divided voltage Vh_div when shutoff of the AC power supply is detected. The components corresponding to the example of FIG. 2 are given the same reference numerals and repetitive explanation is omitted.

The voltage dividing unit 110 may include the first voltage dividing resistor 112, the second voltage dividing resistor 114, the third voltage dividing resistor 116, and the first switch 118. The voltage dividing unit 110 generates the divided voltage Vh_div using the first voltage division ratio involving the first voltage dividing resistor 112, the second voltage dividing resistor 114, and the third voltage dividing resistor 116, and the second voltage division ratio involving the first voltage dividing resistor 112 and the second voltage dividing resistor 114.

The first voltage dividing resistor 112 is connected between the first node N1 and the second node N2. The resistance value Rdiv1 of the first voltage dividing resistor 112 may be 30 MΩ or more and 750 MΩ or less. As an example, the resistance value Rdiv1 of the first voltage dividing resistor 112 is 149 MΩ.

The second voltage dividing resistor 114 is connected between the second node N2 and the ground. The resistance value Rdiv2 of the second voltage dividing resistor 114 may be 0.3 MΩ2 or more and 7.5 MΩ or less. As an example, the resistance value Rdiv2 of the second voltage dividing resistor 114 is 1.505 MΩ.

The third voltage dividing resistor 116 is connected at one end to the second node N2 and connected in parallel with the second voltage dividing resistor 114. The resistance value Rdiv3 of the third voltage dividing resistor 116 may be 0.6 MΩ or more and 15 MΩ or less. As an example, the resistance value Rdiv3 of the third voltage dividing resistor 116 is 2.98 MΩ.

The first switch 118 is connected between another end of the third voltage dividing resistor 116 and the ground. By controlling the on/off state of the first switch, the voltage division ratio at which the voltage dividing unit 110 generates the divided voltage Vh_div may be changed.

When the first switch is in the on state, the resistors that constitute the voltage dividing unit 110 are the first voltage dividing resistor 112 and the parallel-connected second voltage dividing resistor 114 and third voltage dividing resistor 116, connected in series. Accordingly, the first voltage division ratio set by the voltage dividing unit 110 when the first switch is in the on state is expressed by Equation 3.

$$\text{First voltage division ratio} = \qquad \text{Equation 3}$$
$$(Rdiv2\|Rdiv3)/(Rdiv1 + (Rdiv2\|Rdiv3))$$

wherein (Rdiv2‖Rdiv3) represents a combined resistance of the parallel-connected second voltage dividing resistor 114 and third voltage dividing resistor 116. When the first switch is in the on state, the divided voltage Vh_div is obtained by multiplying the input voltage VH by the first voltage division ratio. As an example, assuming that the resistance value Rdiv1 of the first voltage dividing resistor 112 is 149 MΩ, the resistance value Rdiv2 of the second voltage dividing resistor 114 is 1.505 MΩ, and the resistance value Rdiv3 of the third voltage dividing resistor 116 is 2.98 MΩ, the first voltage division ratio is approximately 1/150 and the divided voltage Vh_div is equal to the input voltage VH multiplied by 1/150.

When the first switch is in the off state, the resistors that constitute the voltage dividing unit 110 are the first voltage dividing resistor 112 and the second voltage dividing resistor 114 connected in series. Accordingly, the second voltage division ratio set by the voltage dividing unit 110 when the first switch is in the off state is expressed by Equation 4.

$$\text{Second voltage division ratio} = Rdiv2/(Rdiv1 + Rdiv2) \qquad \text{Equation 4}$$

That is, when the first switch is in the off state, the divided voltage Vh_div is obtained by multiplying the input voltage VH by the second voltage division ratio. As an example, assuming that the resistance value Rdiv1 of the first voltage dividing resistor 112 is 149 MΩ and the resistance value Rdiv2 of the second voltage dividing resistor 114 is 1.505 MΩ, the second voltage division ratio is approximately 1/100 and the divided voltage Vh_div is equal to the input voltage VH multiplied by 1/100.

The voltage dividing unit 110 may set the ratio of the divided voltage Vh_div to the input voltage VH to the first voltage division ratio when no shutoff of the AC power supply is detected, and may set the ratio of the divided voltage Vh_div to the input voltage VH to the second voltage division ratio higher than the first voltage division ratio when shutoff of the AC power supply is detected. That is, when no shutoff from the AC power supply is detected, the first switch is controlled to be in the on state and the voltage dividing unit 110 may generate the divided voltage Vh_div at the first voltage division ratio, and when shutoff of the AC power supply is detected, the first switch is controlled to be in the off state and the voltage dividing unit 110 may generate the divided voltage Vh_div at the second voltage division ratio.

The first voltage dividing resistor 112, the second voltage dividing resistor 114, the third voltage dividing resistor 116, the discharge resistor 142, and the protective resistor 70 may satisfy Equation 5.

$$\frac{Rdiv2}{Rdiv1 + Rdiv2} \bigg/ \frac{Rdiv2\|Rdiv3}{Rdiv1 + Rdiv2\|Rdiv3} = \frac{Rdis + Rpro}{Rdis} \qquad \text{Equation 5}$$

That is, the proportion of voltage division which is a ratio of the second voltage division ratio to the first voltage division ratio (left-hand side) may be equal to (Rdis+Rpro)/Rdis. The proportion of voltage division which is a ratio of the second voltage division ratio to the first voltage division ratio may be 1.1 or more and 2 or less. As an example, assuming that the resistance value Rdis of the discharge resistor 142 is 10 kΩ and the resistance value Rpro of the protective resistor 70 is 5 kΩ, the proportion of voltage division is 1.5.

As described above, when the discharge switch 144 is in the off state, no significant influence of the voltage drop caused by the protective resistor 70 is experienced and the input voltage VH can be considered to be almost the same as Vcx, whereas when the discharge switch 144 is in the on state, the influence of the voltage drop caused by the protective resistor 70 cannot be ignored and the input voltage VH is equal to the Vcx multiplied by Rdis/(Rpro+Rdis). Accordingly, by setting the proportion of voltage division which is the ratio of the second voltage division ratio to the first voltage division ratio to (Rdis+Rpro)/Rdis, the influence of the voltage drop caused by the protective resistor 70 can be compensated and the values of the divided voltage Vh_div can be kept almost the same between the situation in which discharging is in progress and the situation in which discharging is not in progress.

In this manner, by setting the different voltage division ratios between the situation in which the discharge switch 144 is in the off state and the situation in which the discharge switch 144 is in the on state, the voltage dividing unit 110 according to the present example is capable of performing discharging while taking into account the influence of the voltage drop caused by the protective resistor 70 and reliably discharging the accumulated charge remaining in the capacitors C1, C2 of the input circuit 10.

The shutoff detection unit 120 may include the shutoff detection circuit 122 and a NOT circuit 132. The shutoff detection circuit 122 may have the same configuration as the example described in FIG. 2.

The NOT circuit 132 is connected between the timer circuit 128 and the first switch 118. The NOT circuit 132 may output a signal S4 which is obtained by inverting the output signal S2 of the timer circuit 128. That is, when the output signal S2 of the timer circuit 128 is at high level, the output signal S4 of the NOT circuit may be at low level, and when the output signal S2 of the timer circuit 128 is at low level, the output signal S4 of the NOT circuit may be at high level.

The shutoff detection unit 120 may control the first switch 118 to be in the on state when no shutoff of the AC power supply is detected, and may control the first switch 118 to be in the off state when shutoff of the AC power supply is detected. By keeping the output signal S2 of the timer circuit 128 at low level when no shutoff of the AC power supply is detected, the output signal S4 of the NOT circuit 132 is kept at high level and the first switch 118 is controlled to be in the on state. By keeping the output signal S2 of the timer circuit 128 at high level when shutoff of the AC power supply is detected, the output signal S4 of the NOT circuit 132 is kept at low level and the first switch 118 is controlled to be in the off state.

Figure 5:
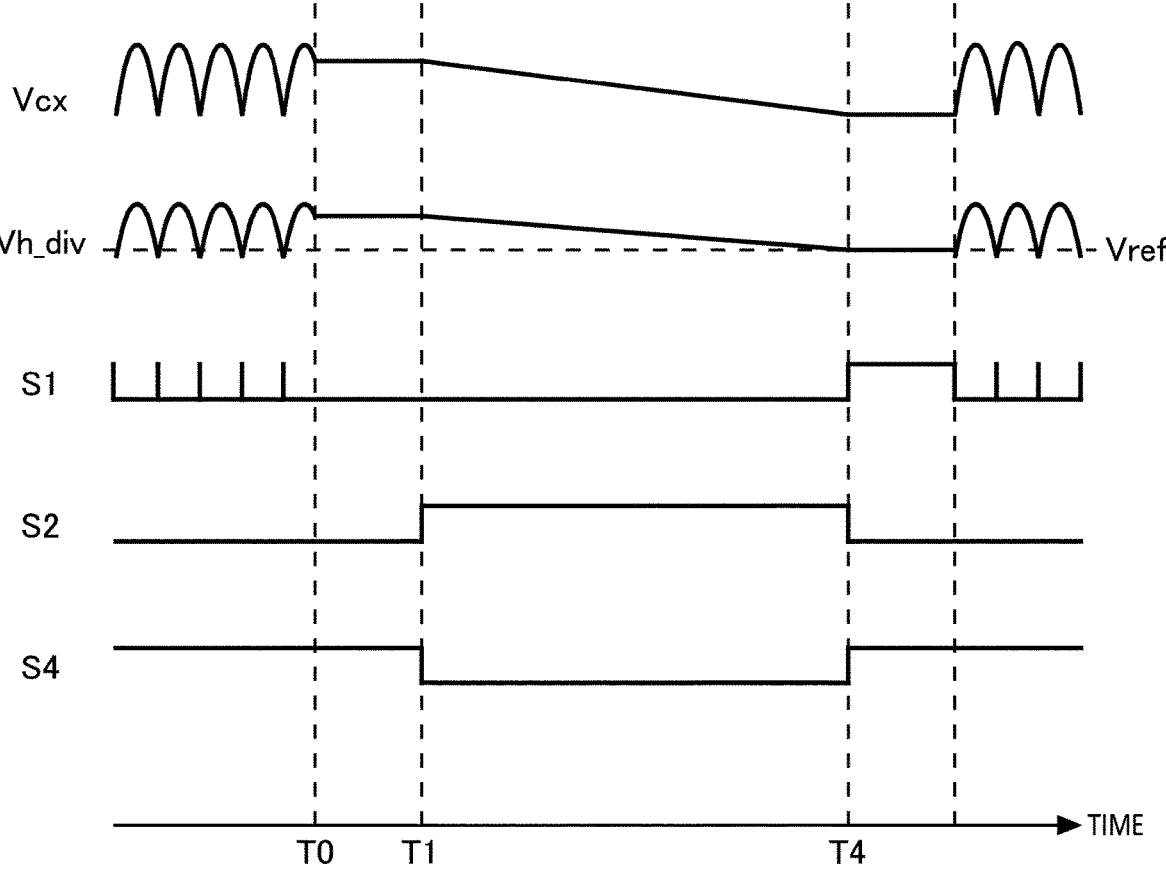
FIG. 5 illustrates a modification example of a waveform diagram representing an operation of the integrated circuit 100 for a power supply.

FIG. 5 illustrates a modification example of a waveform diagram representing an operation of the integrated circuit 100 for a power supply. The first row represents a temporal waveform of the output voltage Vcx of the full-wave rectifying circuit 60, the second row represents a temporal waveform of the divided voltage Vh_div, the third row represents an output signal S1 of the comparator 126, the fourth row represents an output signal S2 of the timer circuit 128, and the fifth row represents an output signal S4 of the NOT circuit 132. The operations corresponding to the example of FIG. 3 are given the same reference numerals and repetitive explanation is omitted.

Before time T0, the power supply system 1000 is connected to the AC power supply and the output signal S2 of the timer circuit 128 is at low level. Accordingly, the output signal S4 of the NOT circuit 132 is high level. In this situation, the voltage dividing unit 110 generates the divided voltage Vh_div at the first voltage division ratio expressed by Equation 3. That is, the voltage dividing unit 110 sets the ratio of the divided voltage Vh_div to the input voltage VH to the first voltage division ratio when shutoff of the AC power supply is not detected.

When the output signal S2 of the timer circuit 128 becomes high level at time T1, the output signal S4 of the NOT circuit 132 becomes low level. In this situation, the voltage dividing unit 110 generates the divided voltage Vh_div at the second voltage division ratio expressed by Equation 4. That is, the voltage dividing unit 110 sets the ratio of the divided voltage Vh_div to the input voltage VH to the second voltage division ratio greater than the first voltage division ratio when shutoff of the AC power supply is detected.

The temporal waveform of the divided voltage Vh_div may vary continuously from time T1. Before time T1, the discharge switch 144 is in the off state, so the input voltage VH is almost the same as Vcx. Also, the first switch 118 is in the on state, so the divided voltage Vh_div is generated at the first voltage division ratio. After time T1, the discharge switch 144 is in the on state, so the input voltage VH is equal to Vcx multiplied by Rdis/Rpro+Rdis. Also, the first switch 118 is in the off state, so the divided voltage Vh_div is generated at the second voltage division ratio. Here, the proportion of voltage division which is a ratio of the second voltage division ratio to the first voltage division ratio satisfy Equation 5, meaning that the second voltage division ratio is equal to the first voltage division ratio multiplied by Rpro+

Rdis/Rdis, so the influence of voltage drop caused by the protective resistor 70 can be compensated by the change of the voltage division ratio.

By setting the voltage division ratio at which the voltage dividing unit 110 generates the divided voltage Vh_div to the first voltage division ratio when the discharge switch 144 is controlled to be in the off state and discharging is not in progress, and setting the voltage division ratio at which the voltage dividing unit 110 generates the divided voltage Vh_div to the second voltage division ratio greater than the first voltage division ratio when the discharge switch 144 is controlled to be in the on state and discharging is in progress, it is possible to detect the discharge state while taking into account the influence of voltage drop caused by the protective resistor 70 and the accumulated charge remaining in the capacitors C1, C2 of the input circuit 10 can be reliably discharged.

In addition, by changing the voltage division ratio to take into account the influence of voltage drop caused by the protective resistor 70, the accumulated charge remaining in the capacitors C1, C2 of the input circuit 10 can be reliably discharged by a simple configuration. By changing the voltage division ratio to take into account the influence of voltage drop caused by the protective resistor 70, the accumulated charge remaining in the capacitors C1, C2 of the input circuit 10 can be reliably discharged in a short time without including discharge suspension periods.

Figure 6:
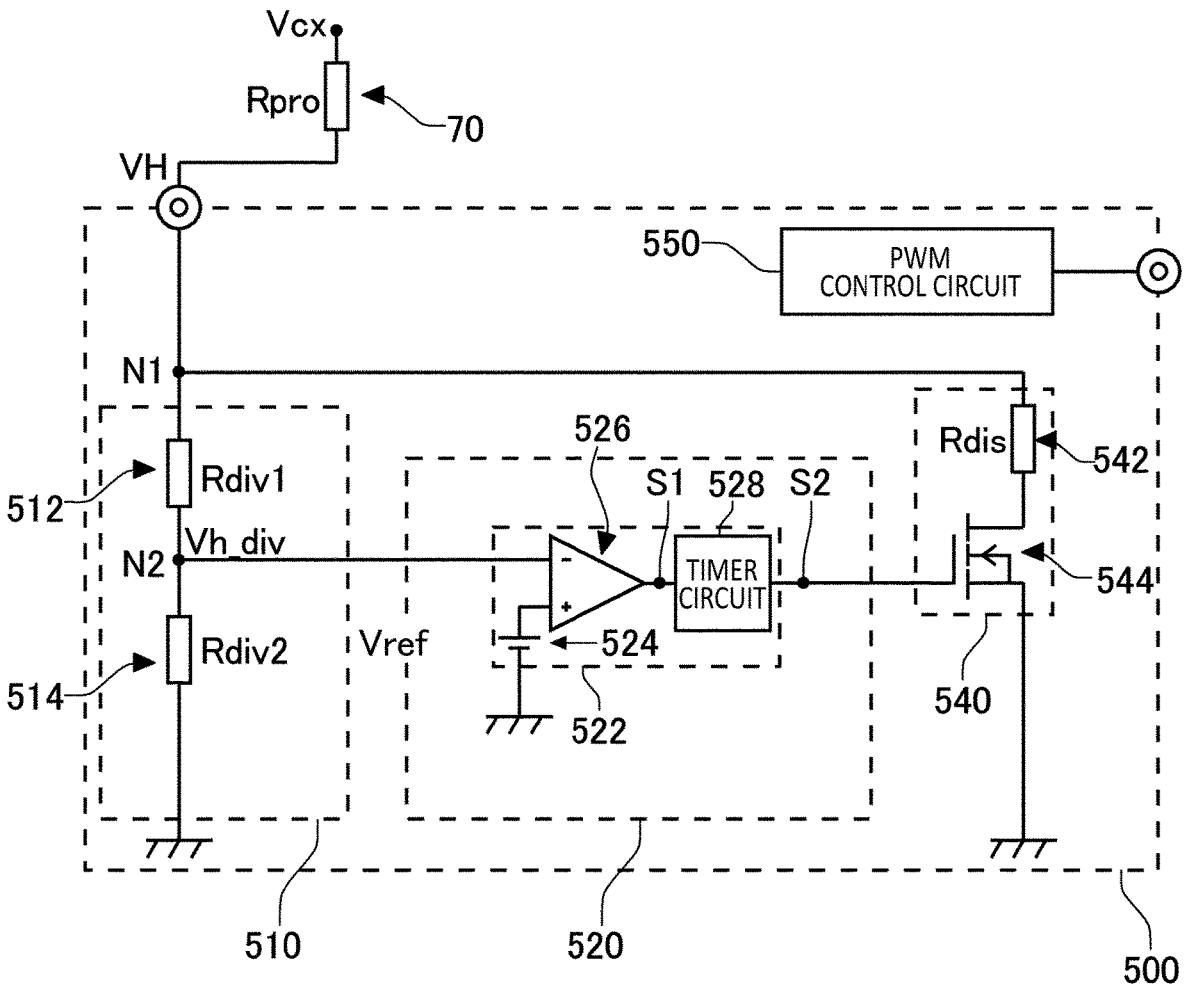
FIG. 6 illustrates an example of a configuration of an integrated circuit 500 for a power supply pertaining to a comparative example.

FIG. 6 illustrates an example of a configuration of an integrated circuit 500 for a power supply pertaining to a comparative example. The components corresponding to the examples of FIG. 2 and FIG. 4 are given similar reference numerals and repetitive explanation is omitted. For example, the first voltage dividing resistor 512 corresponds to the first voltage dividing resistor 112.

The voltage dividing unit 510 pertaining to the comparative example is in common with the example of FIG. 2 in that it includes the first voltage dividing resistor 512 and the second voltage dividing resistor 514, but is different from the example of FIG. 4 in that it does not include the third voltage dividing resistor and the first switch. That is, there is only one voltage division ratio at which the voltage dividing unit 510 generates the divided voltage Vh_div. The shutoff detection unit 520 pertaining to the comparative example is different from the examples of FIG. 2 and FIG. 4 in that it does not include the pulse generation circuit and NOT circuit.

Due to the differences described above, the integrated circuit 500 for a power supply pertaining to the comparative examples does not take into account the influence of voltage drop caused by the protective resistor 70.

Figure 7:
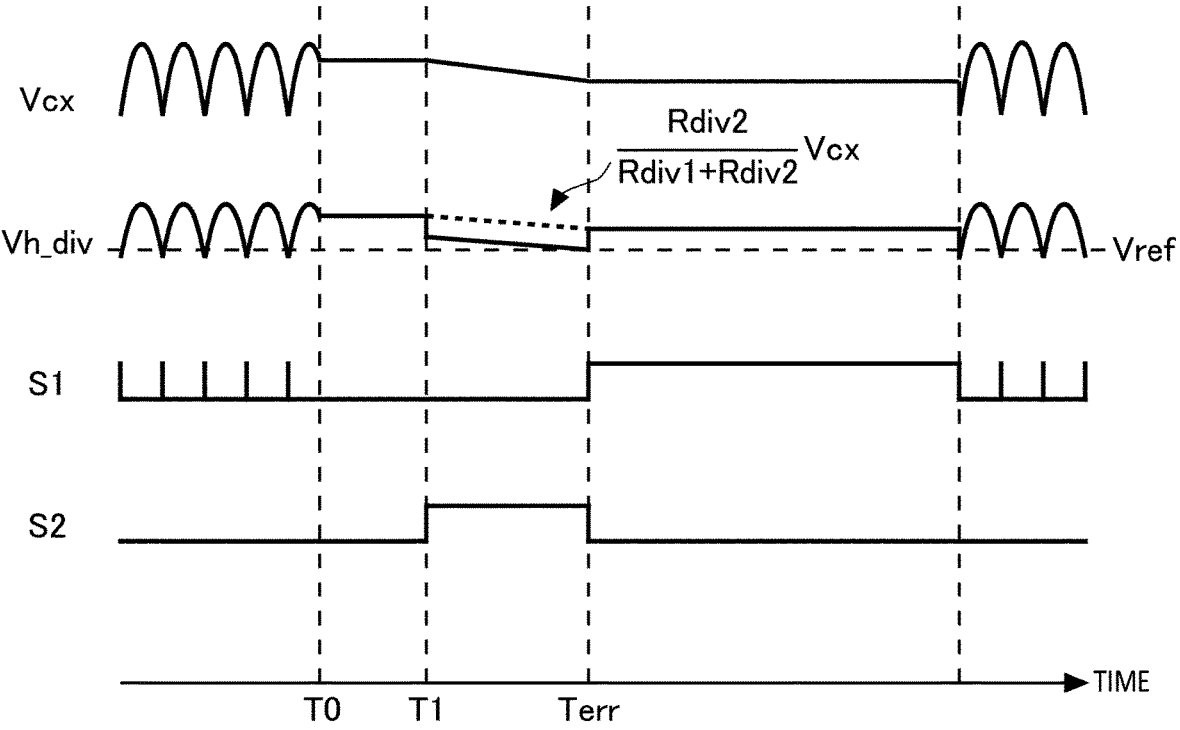
FIG. 7 illustrates an example of the waveform diagram representing an operation of the integrated circuit 500 for a power supply pertaining to a comparative example.

FIG. 7 illustrates an example of the waveform diagram representing an operation of the integrated circuit 500 for a power supply pertaining to a comparative example. The first row represents a temporal waveform of the output voltage Vcx of the full-wave rectifying circuit 60, the second row represents a temporal waveform of the divided voltage Vh_div, the third row represents an output signal S1 of the comparator 526, and the fourth row represents an output signal S2 of the timer circuit 528.

When the output signal S2 of the timer circuit 528 becomes high level at time T1, the discharging starts. The discharge switch 544 is turned into the on state and the influence of the voltage drop caused by the protective resistor 70 cannot be ignored, leading to a fall of the divided voltage Vh_div. The divided voltage Vh_div falls below the reference voltage Vref at time Terr, so the end of discharging of the accumulated charge remaining in the capacitors C1, C2 of the input circuit 10 is detected, the output signal S2 of the timer circuit 528 becomes low level, and the discharge switch 544 is turned into the off state. However, because the influence of voltage drop caused by the protective resistor 70 has not been taken into account, actually the accumulated charge remains to the extent that the divided voltage Vh_div is above the reference voltage Vref, and there is a risk that the accumulated charge remaining in the capacitors C1, C2 of the input circuit 10 cannot be discharged reliably.

While the present invention has been described by way of the embodiments, the technical scope of the present invention is not limited to the above described embodiments. It is apparent to persons skilled in the art that various alterations or improvements can be made to the above described embodiments. It is apparent from the description of the claims that embodiments added with such alterations or improvements can also be included in the technical scope of the present invention.

It should be noted that the operations, procedures, steps, stages, and the like of each process performed by an apparatus, system, program, and method shown in the claims, specifications, or drawings can be realized in any order as long as the order is not indicated by "prior to," "before," or the like and as long as the output from a previous process is not used in a later process. Even if the operation flow is described using phrases such as "first" or "next" in the claims, specifications, or drawings for convenience, it does not necessarily mean that the process must be performed in this order.

Examples

In the first aspect according to the present invention, an integrated circuit for a power supply is provided that is connected to an AC power supply via an input circuit including a capacitor, comprising: a voltage dividing unit that divides an input voltage to generate a divided voltage; a shutoff detection unit that compares the divided voltage with a predetermined reference voltage to detect shutoff of the AC power supply; and a discharge unit that discharges accumulated charge in the capacitor when shutoff of the AC power supply is detected, wherein the voltage dividing unit sets a ratio of the divided voltage to the input voltage to a first voltage division ratio when no shutoff of the AC power supply is detected, and sets a ratio of the divided voltage to the input voltage to a second voltage division ratio greater than the first voltage division ratio when shutoff of the AC power supply is detected.

In the integrated circuit for a power supply according to an example described above, the voltage dividing unit may include: a first voltage dividing resistor having a resistance value Rdiv1 connected between a first node and a second node; a second voltage dividing resistor having a resistance value Rdiv2 connected between the second node and a ground; a third voltage dividing resistor having a resistance value Rdiv3 connected at one end to the second node and connected in parallel with the second voltage dividing resistor; and a first switch connected between another end of the third voltage dividing resistor and a ground.

In the integrated circuit for a power supply according to any of the examples described above, the first voltage division ratio may be (Rdiv2∥Rdiv3)/(Rdiv1+ (Rdiv2∥Rdiv3)).

In the integrated circuit for a power supply according to any of the examples described above, the second voltage division ratio may be Rdiv2/(Rdiv1+Rdiv2).

In the integrated circuit for a power supply according to any of the examples described above, the first voltage division ratio may be (Rdiv2∥Rdiv3)/(Rdiv1+ (Rdiv2∥Rdiv3)). The second voltage division ratio may be Rdiv2/(Rdiv1+Rdiv2). The proportion of voltage division which is a ratio of the second voltage division ratio to the first voltage division ratio may be 1.1 or more and 2 or less.

In the integrated circuit for a power supply according to any of the examples described above, the resistance value Rdiv1 of the first voltage dividing resistor may be 30 MΩ or more and 750 MΩ or less.

In the integrated circuit for a power supply according to any of the examples described above, the resistance value Rdiv2 of the second voltage dividing resistor may be 0.3 MΩ or more and 7.5 MΩ or less.

In the integrated circuit for a power supply according to any of the examples described above, the resistance value Rdiv3 of the third voltage dividing resistor may be 0.6 MΩ or more and 15 MΩ or less.

In the integrated circuit for a power supply according to any of the examples described above, the shutoff detection unit may control the first switch to be in an on state when no shutoff of the AC power supply is detected, and control the first switch to be in an off state when shutoff of the AC power supply is detected.

In the integrated circuit for a power supply according to any of the examples described above, the discharge unit may include a discharge resistor having a resistance value Rdis connected to the first node. The first node may be connected to the capacitor via a protective resistor having a resistance value Rpro. The resistance values of the first voltage dividing resistor, the second voltage dividing resistor, the third voltage dividing resistor, the discharge resistor, and the protective resistor may satisfy Equation 1.

$$\frac{Rdiv2}{Rdiv1+Rdiv2} \bigg/ \frac{Rdiv2\|Rdiv3}{Rdiv1+Rdiv2\|Rdiv3} = \frac{Rdis+Rpro}{Rdis} \qquad \text{Equation 1}$$

In the integrated circuit for a power supply according to any of the examples described above, the resistance value Rdis of the discharge resistor may be 2 kΩ or more and 50 kΩ or less.

In the integrated circuit for a power supply according to any of the examples described above, the resistance value Rpro of the protective resistor may be 1 kΩ or more and 25 kΩ or less.

In the integrated circuit for a power supply according to any of the examples described above, the discharge unit may include a discharge resistor having a resistance value Rdis connected at one end to the first node and connected in parallel with the first voltage dividing resistor and a second switch connected between another end of the discharge resistor and a ground. The shutoff detection unit may control the second switch to be in an off state when no shutoff of the AC power supply is detected, and control the second switch to be in an on state when shutoff of the AC power supply is detected.

In the integrated circuit for a power supply according to any of the examples described above, the shutoff detection unit may include a comparator that compares the divided voltage with the reference voltage and a timer circuit that measures an elapsed time from when an output signal of the comparator indicates that the divided voltage becomes lower than the reference voltage.

In the integrated circuit for a power supply according to any of the examples described above, the shutoff detection unit may detect shutoff of the AC power supply when the elapsed time measured by the timer circuit exceeds a predetermined reference time.

In the second aspect according to the present invention, a power supply system is provided that comprises: an input circuit that includes a capacitor; and an integrated circuit for a power supply that is connected to an AC power supply via the input circuit, the integrated circuit for a power supply including: a voltage dividing unit that divides an input voltage to generate a divided voltage; a shutoff detection unit that compares the divided voltage with a predetermined reference voltage to detect shutoff of the AC power supply; and a discharge unit that discharges accumulated charge in the capacitor when shutoff of the AC power supply is detected, wherein the voltage dividing unit sets a ratio of the divided voltage to the input voltage to a first voltage division ratio when no shutoff of the AC power supply is detected, and sets a ratio of the divided voltage to the input voltage to a second voltage division ratio greater than the first voltage division ratio when shutoff of the AC power supply is detected.

In the power supply system according to the example described above, the voltage dividing unit may include: a first voltage dividing resistor having a resistance value Rdiv1 connected between a first node and a second node; a second voltage dividing resistor having a resistance value Rdiv2 connected between the second node and a ground; a third voltage dividing resistor having a resistance value Rdiv3 connected at one end to the second node and connected in parallel with the second voltage dividing resistor; and a first switch connected between another end of the third voltage dividing resistor and a ground.

The power supply system according to any of the examples described above may comprise a protective resistor having a resistance value Rpro connected between the capacitor and the first node. The discharge unit may include a discharge resistor having a resistance value Rdis connected to the first node. The resistance values of the first voltage dividing resistor, the second voltage dividing resistor, the third voltage dividing resistor, the discharge resistor, and the protective resistor may satisfy Equation 2.

$$\frac{Rdiv2}{Rdiv1 + Rdiv2} \Big/ \frac{Rdiv2 \| Rdiv3}{Rdiv1 + Rdiv2 \| Rdiv3} = \frac{Rdis + Rpro}{Rdis} \qquad \text{Equation 2}$$

EXPLANATION OF REFERENCES

10 input circuit, 20 primary rectifying and smoothing circuit, 30 transformer, 40 secondary rectifying and smoothing circuit, 50 switch for a transformer, 52 gate resistor, 60 full-wave rectifying circuit, 70 protective resistor, 100 integrated circuit for a power supply, 110 voltage dividing unit, 112 first voltage dividing resistor, 114 second voltage dividing resistor, 116 third voltage dividing resistor, 118 first switch, 120 shutoff detection unit, 122 shutoff detection circuit, 124 voltage supply, 126 comparator, 128 timer circuit, 130 pulse generation circuit, 132 NOT circuit, 140 discharge unit, 142 discharge resistor, 144 discharge switch, 150 PWM control circuit, 1000 power supply system.

16

What is claimed is:

1. An integrated circuit for a power supply that is connected to an AC power supply via an input circuit including a capacitor, comprising:
   a voltage dividing unit that divides an input voltage to generate a divided voltage;
   a shutoff detection unit that compares the divided voltage with a predetermined reference voltage to detect shutoff of the AC power supply; and
   a discharge unit that pulse-discharges accumulated charge in the capacitor in pulses when shutoff of the AC power supply is detected,
   wherein the voltage dividing unit sets a ratio of the divided voltage to the input voltage to a first voltage division ratio when no shutoff of the AC power supply is detected, and sets a ratio of the divided voltage to the input voltage to a second voltage division greater than the first voltage division ratio when shutoff of the AC power supply is detected, and
   wherein when the shutoff detection unit outputs an output signal to the voltage dividing unit and the discharge unit, the voltage dividing unit changes the ratio of the divided voltage to the input voltage from the first voltage division ratio to the second voltage division ratio according to the output signal, and the discharge unit pulse-discharges accumulated charge in the capacitor in pulses according to the output signal.

2. The integrated circuit for a power supply according to claim 1, wherein the voltage dividing unit includes:
   a first voltage dividing resistor having a resistance value Rdiv1 connected between a first node and a second node;
   a second voltage dividing resistor having a resistance value Rdiv2 connected between the second node and a ground;
   a third voltage dividing resistor having a resistance value Rdiv3 connected at one end to the second node and connected in parallel with the second voltage dividing resistor; and
   a first switch connected between another end of the third voltage dividing resistor and a ground.

3. The integrated circuit for a power supply according to claim 1, wherein the shutoff detection unit controls the first switch to be in an on state according to the output signal when no shutoff of the AC power supply is detected, and controls the first switch to be in an off state according to the output signal when shutoff of the AC power supply is detected.

4. The integrated circuit for a power supply according to claim 1, wherein
   the discharge unit includes
   a discharge resistor having a resistance value Rdis connected at one end to the first node and connected in parallel with the first voltage dividing resistor, and
   a second switch connected between another end of the discharge resistor and a ground, and
   wherein the shutoff detection unit controls the second switch to be in an off state according to the output signal when no shutoff of the AC power supply is detected, and controls the second switch to be in an on state according to the output signal when shutoff of the AC power supply is detected.

* * * * *